(12) United States Patent
Xie et al.

(10) Patent No.: US 12,276,996 B2
(45) Date of Patent: Apr. 15, 2025

(54) POWER ON/OFF CIRCUIT AND ELECTRONIC VAPORIZATION DEVICE

(71) Applicant: Shenzhen Moore Vaporization Health & Medical Technology Co., Ltd., Guangdong (CN)

(72) Inventors: Xitian Xie, Shenzhen (CN); Zhonghua Tan, Shenzhen (CN)

(73) Assignee: Shenzhen Moore Vaporization Health & Medical Technology Co., Ltd., Shenzhen (CN)

( * ) Notice: Subject to any disclaimer, the term of this patent is extended or adjusted under 35 U.S.C. 154(b) by 303 days.

(21) Appl. No.: 17/987,202

(22) Filed: Nov. 15, 2022

(65) Prior Publication Data

US 2023/0161367 A1    May 25, 2023

(30) Foreign Application Priority Data

Nov. 19, 2021    (CN) .......................... 202122873157.3

(51) Int. Cl.
  *G05F 1/565*    (2006.01)
  *A24F 40/51*    (2020.01)
  (Continued)

(52) U.S. Cl.
  CPC .............. *G05F 1/59* (2013.01); *A24F 40/51* (2020.01); *G05F 1/565* (2013.01); *G05F 1/575* (2013.01); *H03K 17/97* (2013.01); *H05B 1/0202* (2013.01)

(58) Field of Classification Search
  CPC .......... H03K 2217/94042; H03K 2217/96058; H03K 17/96; H03K 17/965; H03K 17/97;
  (Continued)

(56) References Cited

U.S. PATENT DOCUMENTS

2005/0040792 A1    2/2005  Nair
2014/0157029 A1*   6/2014  Takahashi ............... G06F 1/263
                                                      713/323
(Continued)

FOREIGN PATENT DOCUMENTS

CN    102971955 A    3/2013
CN    104037720 A    9/2014
(Continued)

OTHER PUBLICATIONS

European Patent Office, Search Report in European Patent Application No. 22207743.0 (Mar. 23, 2023).
(Continued)

*Primary Examiner* — Thienvu V Tran
*Assistant Examiner* — Shahzeb K Ahmad
(74) *Attorney, Agent, or Firm* — Leydig, Voit & Mayer, Ltd.

(57) ABSTRACT

A power on/off circuit includes: a sensor for generating a corresponding first control signal based on a user operation; a first switch element, a first end of the first switch element being connected to a voltage input end, a second end of the first switch element being connected to a voltage output end, the voltage input end being connected to a power supply voltage; and a capacitor connected between a third end of the first switch element and the sensor, the capacitor controlling an on-off of the first switch element based on the first control signal.

9 Claims, 4 Drawing Sheets

(51) Int. Cl.
  *G05F 1/575*   (2006.01)
  *G05F 1/59*    (2006.01)
  *H03K 17/97*   (2006.01)
  *H05B 1/02*    (2006.01)

(58) Field of Classification Search
  CPC . G05F 1/56; G05F 1/565; G05F 1/575; G05F 1/59; A24F 40/50; A24F 40/51; H05B 1/0202
  See application file for complete search history.

(56) References Cited

U.S. PATENT DOCUMENTS

| | | | | |
|---|---|---|---|---|
| 2021/0401058 | A1* | 12/2021 | Yan | H02M 3/155 |
| 2022/0085637 | A1* | 3/2022 | Liu | H02J 7/04 |
| 2023/0018700 | A1* | 1/2023 | Ohashi | H02J 9/005 |
| 2024/0154439 | A1* | 5/2024 | Liu | G01V 3/081 |

FOREIGN PATENT DOCUMENTS

| | | | | |
|---|---|---|---|---|
| CN | 107404314 | A | * | 11/2017 |
| JP | 764678 | A | | 3/1995 |
| JP | H-0764678 | A | * | 3/1995 |
| WO | 2021200443 | A1 | | 10/2021 |

OTHER PUBLICATIONS

European Patent Office, Search Report in European Patent Application No. 22207743.0 (Jul. 3, 2023).

* cited by examiner

POWER ON/OFF CIRCUIT AND ELECTRONIC VAPORIZATION DEVICE

CROSS-REFERENCE TO PRIOR APPLICATION

Priority is claimed to Chinese Patent Application No. 202122873157.3, filed on Nov. 19, 2021, the entire disclosure of which is hereby incorporated by reference herein.

FIELD

This application relates to the field of switch circuits, and in particular, to a power on/off circuit and an electronic vaporization device.

BACKGROUND

A battery-powered product is usually provided with a power on/off circuit to shut down during an idle period to reduce power consumption while improving battery life time.

A type of power on/off circuit using a sensor as a starting element is popular on the market. When a user performs a power-on operation, a sensor outputs a power-on signal to make a circuit conductive, so as to achieve the purpose of power-on.

However, when the sensor is not reset for some reason and a power-off operation is subsequently performed, the sensor continuously outputs the power-on signal. As a result, the power on/off circuit cannot be disconnected, the circuit continuously supplies power, the standby current is large, and the battery usage time is reduced.

SUMMARY

In an embodiment, the present invention provides a power on/off circuit, comprising: a sensor configured to generate a corresponding first control signal based on a user operation; a first switch element, a first end of the first switch element being connected to a voltage input end, a second end of the first switch element being connected to a voltage output end, the voltage input end being connected to a power supply voltage; and a capacitor connected between a third end of the first switch element and the sensor, the capacitor being configured to control an on-off of the first switch element based on the first control signal.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
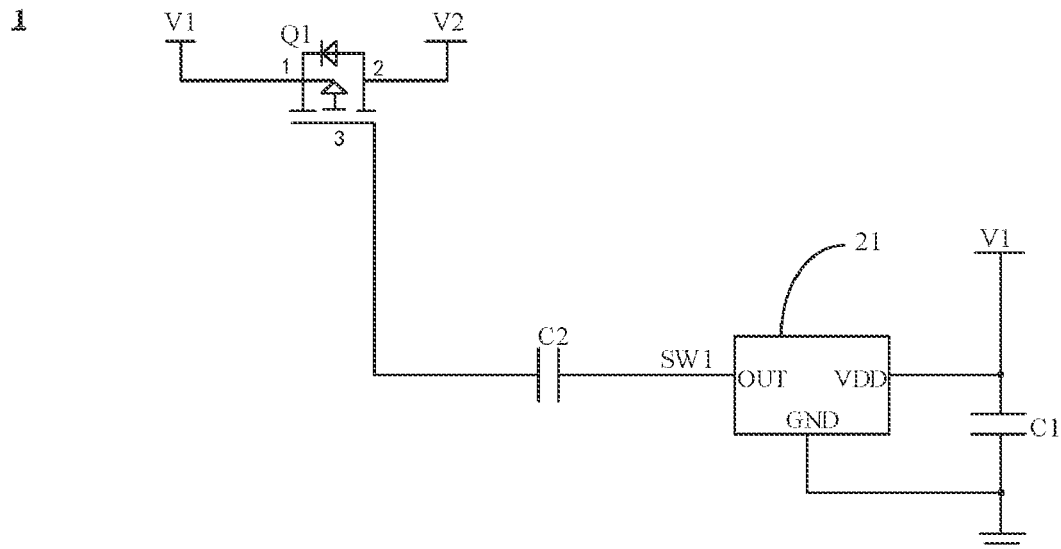
FIG. 1 is a circuit diagram of a power on/off circuit according to a first embodiment of this application.

In an embodiment, the present invention provides a power on/off circuit, which can prevent the power on/off circuit from being continuously conductive and failing to shut down when a sensor is not reset.

In an embodiment, the present invention provides a power on/off circuit, including a sensor, a first switch element, and a capacitor. The sensor generates a corresponding first control signal based on a user operation; a first end of the first switch element is connected to a voltage input end, a second end of the first switch element is connected to a voltage output end, where the voltage input end is connected to a power supply voltage; and the capacitor is connected between a third end of the first switch element and the sensor, and controls whether the first switch element is conductive based on the first control signal.

The first control signal is switched to a logic low level when the sensor is triggered based on a power-on operation of the user; and the first control signal is switched to a logic high level when the sensor is reset.

The power on/off circuit further includes a control chip, the control chip including a signal output port, the signal output port being connected to a third end of the first switch element and configured to issue a second control signal to control whether the first switch element is conductive.

The power on/off circuit further includes a control chip and a second switch element, the control chip including a signal output port, a first end of the second switch element being connected to a ground voltage, a second end of the second switch element being connected to a third end of the first switch element, where a third end of the second switch element is connected to the signal output port to receive a second control signal issued by the control chip; and the control chip issues the second control signal to control the on-off of the second switch element.

The power on/off circuit further includes a first resistor, a first end of the first resistor is connected to the voltage input end, and a second end of the first resistor is connected to a third end of the first switch element and an end of the capacitor at the same time.

The power on/off circuit further includes a first diode, a cathode of the first diode is connected to the voltage input end, and an anode of the first diode is connected to a first end of the capacitor.

The power on/off circuit further includes a second diode, a cathode of the second diode is connected to a first end of the capacitor or a second end of the capacitor connected to the sensor, and an anode of the second diode is connected to a detection feedback port of the control chip to feed back a change in the first control signal to the control chip.

When a cathode of the second diode is connected to a first end of the capacitor, the power on/off circuit further includes a third diode, an anode of the third diode is connected to a third end of the first switch element, and a cathode of the third diode is connected to a first end of the capacitor.

The first switch element is a PMOS transistor, and the second switch element is an NMOS transistor.

To resolve the above technical problems, a second technical solution according to this application is to provide an electronic vaporization device, including the power on/off circuit according to any one of the above description.

The beneficial effect of this application is different from that in the prior art. The power on/off circuit and the electronic vaporization device according to this application include a sensor, a first switch element, and a capacitor. The sensor generates a corresponding first control signal based on a user operation; a first end of the first switch element is connected to a voltage input end, a second end of the first switch element is connected to a voltage output end, where the voltage input end is connected to a power supply voltage; and the capacitor is connected between a third end of the first switch element and the sensor, and controls whether the first switch element is conductive based on the first control signal. The power on/off circuit can prevent the power on/off circuit from being continuously conductive and failing to shut down when a sensor is not reset.

The technical solutions in the embodiments of this application are clearly and completely described below with reference to the accompanying drawings in the embodiments of this application. Apparently, the described embodiments are merely some rather than all of the embodiments of this application. All other embodiments obtained by a person of ordinary skill in the art based on the embodiments of this application without creative efforts shall fall within the protection scope of this application.

The terms "first", "second", and "third" in this application are used for descriptive purposes only and are not to be construed as indicating or implying relative importance or implicitly indicating the number of technical features indicated. Therefore, features defining "first", "second", and "third" can explicitly or implicitly include at least one of the features.

"Embodiment" mentioned in the specification means that particular features, structures, or characteristics described with reference to the embodiment may be included in at least one embodiment of this application. The term appearing at different positions of the specification may not refer to the same embodiment or an independent or alternative embodiment that is mutually exclusive with another embodiment. A person skilled in the art explicitly or implicitly understands that the embodiments described in the specification may be combined with other embodiments.

Referring to FIG. 1, FIG. 1 is a circuit diagram of a power on/off circuit according to a first embodiment of this application. A power on/off circuit 1 includes a voltage input end VI, a voltage output end V2, a sensor 21, a first switch element Q1, a first capacitor C1, and a second capacitor C2. Specifically, an input side of the sensor 21 is connected to the voltage input end V1 and a first end of the first capacitor C1, a ground side of the sensor 21 is connected to a second end of the first capacitor C1 and a ground voltage, an output side of the sensor 21 is connected to a second end of the second capacitor C2, a first end of the second capacitor C2 is connected to a third end of the first switch element Q1, a first end of the first switch element Q1 is connected to the voltage input end V1, and a second end of the first switch element Q1 is connected to the voltage output end V2. The voltage input end V1 is connected to a power supply voltage and is configured to provide a voltage VIN, the third end of the first switch element Q1 is a control end, the output side of the sensor 21 generates a corresponding first control signal SW1 based on a user operation, and the second capacitor C2 controls the on-off of the first switch element Q1 based on the first control signal SW1.

Specifically, a user operates the sensor 21 to provide the first control signal SW1 to conduct the first switch element Q1 through the second capacitor C2, so as to turn on a battery-powered product. The voltage input end V1 supplies power to a load through the first switch element Q1 and the voltage output end V2. In this embodiment, by arranging the second capacitor C2 between the first switch element Q1 and the sensor 21, that the sensor 21 directly outputs a control signal for the first switch element Q1 is converted into that the sensor 21 outputs a control signal for the first switch element Q1 through the second capacitor C2, which implements the isolation of the sensor 21 from the first switch element Q1, so that the power on/off circuit 1 can be prevented from being continuously conductive and failing to shut down when the sensor 21 is not reset.

Figure 2:
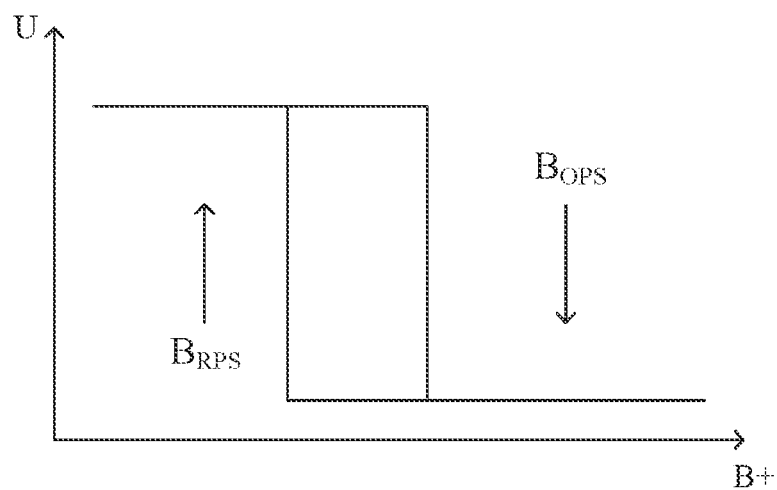
FIG. 2 is a characteristic diagram of a Hall sensor according to this application.

In an implementation, the sensor 21 is a Hall sensor and configured to provide the first control signal SW1. Referring to FIG. 2, FIG. 2 is a characteristic diagram of a Hall sensor according to this application. When the user operates a magnetic element to approach the Hall sensor and the strength of a magnetic field where the Hall sensor is located is greater than a certain value (BOPS), the Hall sensor provides a logic low level to conduct the first switch element Q1; when the user operates the magnetic element away from the Hall sensor or the magnetic element is self-reset, and the strength of the magnetic field where the Hall sensor is located is less than a certain value (BRPS), the Hall sensor provides a logic high level. If there is no second capacitor C2 in the circuit, when the magnetic element is not reset due to improper operations by the user or other reasons, the Hall sensor continuously outputs a logic low level. As a result, the power on/off circuit continuously supplies power, the standby current is large, and the battery usage time is reduced. In this implementation, by arranging the second capacitor C2 between the first switch element Q1 and the sensor 21, that the sensor 21 directly outputs a control signal for the first switch element Q1 is converted into that the sensor 21 outputs a control signal for the first switch element Q1 through the second capacitor C2, which implements the isolation of the sensor 21 from the first switch element Q1, so that the power-off of the circuit can be implemented when the sensor 21 is not reset and the second capacitor C2 outputs a logic high level.

Figure 3:
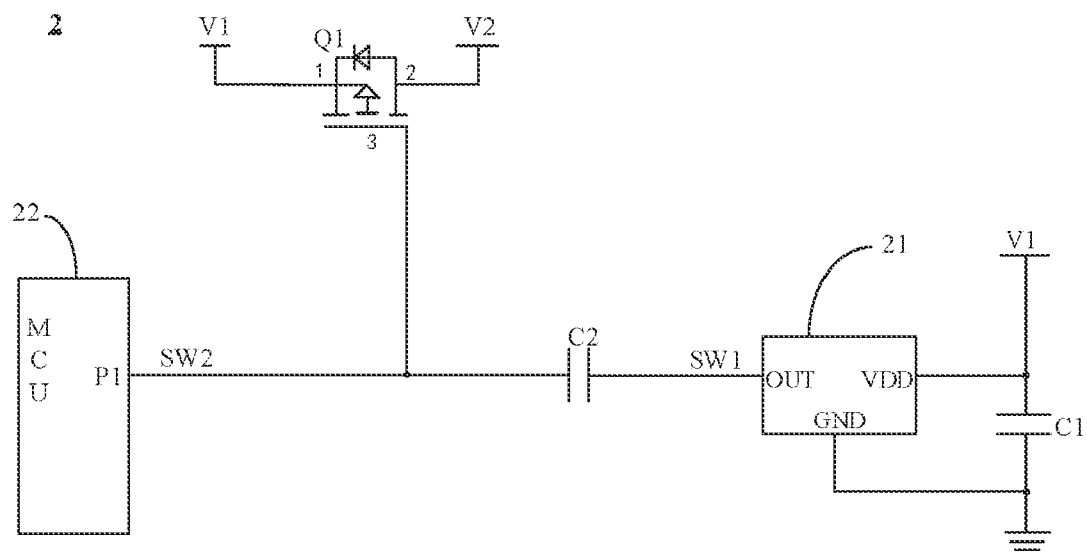
FIG. 3 is a circuit diagram of a power on/off circuit according to a second embodiment of this application.

Referring to FIG. 3, FIG. 3 is a circuit diagram of a power on/off circuit according to a second embodiment of this application. Different from the power on/off circuit 1, a power on/off circuit 2 in this embodiment further includes a control chip 22. The control chip 22 includes a signal output port P1. The signal output port P1 is connected to the third end of the first switch element Q1, and is configured to issue a second control signal SW2 to control the on-off of the first switch element Q1. In this embodiment, the user operates the sensor 21 to provide the first control signal SW1 to conduct the first switch element Q1, so that the battery-powered product is turned on. Even if the sensor 21 is reset and no longer provides the first control signal SW1, the signal output port P1 of the control chip 22 in the battery-powered product can, as required, output the second control signal SW2 through a second switch element Q2 to control the first switch element Q1 to be continuously conductive or shut-off. For example, after the battery-powered product is turned on, the control chip 22 is powered on, and the control chip 22 outputs a logic high level to continuously conduct the first switch element Q1 as required, so as to supply power to the load through the voltage output end V2. Upon completion of the power supply, the control chip 22 may also output a logic low level to shut off the first switch element Q1 as required.

Figure 4:
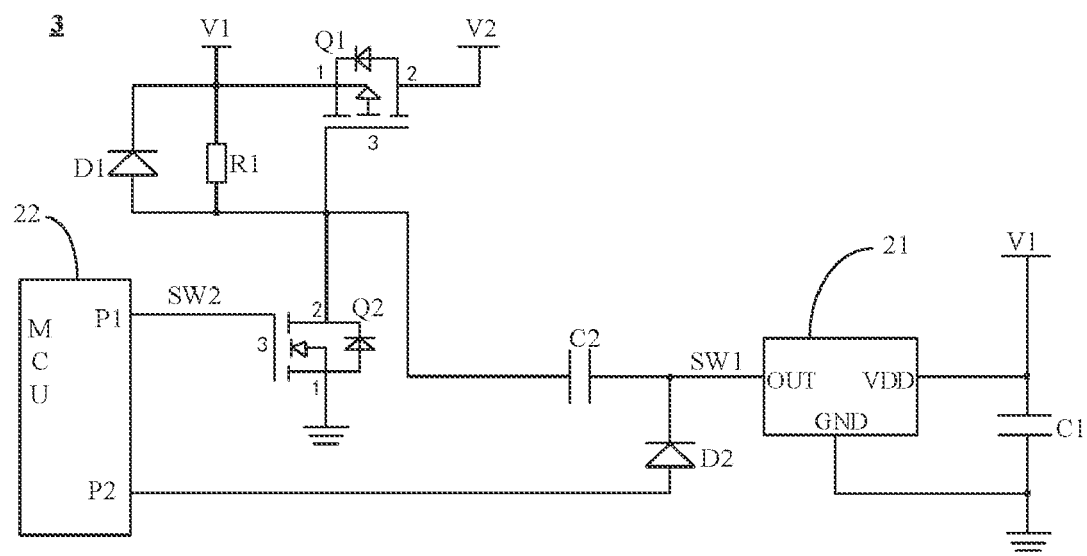
FIG. 4 is a circuit diagram of a power on/off circuit according to a third embodiment of this application.

Referring to FIG. 4, FIG. 4 is a circuit diagram of a power on/off circuit according to a third embodiment of this application. Different from the power on/off circuit 2, a power on/off circuit 3 in this embodiment further includes a first resistor R1, a first diode D1, a second diode D2, the second switch element Q2, and a detection feedback port P2 of the control chip 22. The voltage input end V1 is connected to a first end of the first resistor R1 and a cathode of the first diode D1, and the first end of the second capacitor C2 is connected to a second end of the first resistor R1 and an anode of the first diode D1. A first end of the second switch element Q2 is connected to the ground voltage, a second end of the second switch element Q2 is connected to the third end of the first switch element Q1, where a third end of the second switch element Q2 is a control end, and the third end of the second switch element Q2 is connected to the signal output port. An anode of the second diode D2 is connected to the detection feedback port P2 of the control chip 22, and a cathode of the second diode D2 is connected between the second capacitor C2 and the sensor 21. When the first switch element Q1 is conductive, the battery-powered product is turned on, and the voltage input end V1 charges the second capacitor C2 through the first resistor R1, so that the second capacitor C2 is gradually converted from inputting a logic low level to outputting a logic high level, so as to avoid the continuous conduction of the first switch element Q1 when the sensor 21 is not reset. And the third end of the second switch element Q2 receives the second control signal SW2 issued by the control chip 22, and controls whether the second switch element Q2 is conductive based on the second control signal SW2, thereby determining whether to conduct the first switch element Q1 by the ground voltage. The second diode D2 is connected between the second capacitor C2 and the sensor 21 to feed back a change in the first control signal SW1 to the control chip 22. Specifically, in this embodiment, when the user does not perform a power-on operation or the magnetic element is away from the Hall sensor, the sensor 21 outputs a logic high level. Since the first resistor R1 raises a voltage of the first switch element Q1, the first switch element Q1 is not conductive, the circuit remains a power-off state, and there is no voltage at two ends of the second capacitor C2. When the user performs the power-on operation or the magnetic element is close to the Hall sensor, the sensor 21 outputs a logic low level, since the voltages of the two ends of the second capacitor C2 cannot generate a sudden change, the two ends of the second capacitor C2 both output a low voltage, the voltage of the first switch element Q1 is lowered, the first switch element Q1 is conducted, the battery-powered product is turned on, and the control chip 22 is powered on to execute a control program, so that the first switch element Q1 is maintained continuously conductive when the battery-powered product needs to remain a power-on state and the control chip 22 outputs a logic high level; and the first switch element Q1 is disconnected after the power supply of the battery-powered product is completed or when the load is not powered through the voltage output end V2 within a certain time threshold, and when the control chip 22 outputs a logic low level.

In this embodiment, by arranging the second capacitor C2 on a passage between the sensor 21 and the first switch element Q1, after the power-supplied product is turned on, the second capacitor C2 completes charging through the voltage input end V1 within a certain period of time, so that the third end of the first switch element Q1 returns to a high level. Even if the sensor 21 continues to output a logic low level because there is no power-off operation of the user or the magnetic element is not reset, the control chip 22 can still independently perform control to output the second control signal SW2 as a logic low level to shut off the first switch element Q1 and cut off the current to turn off the battery-powered product.

In this embodiment, the anode of the first diode D1 is connected to the first end of the second capacitor C2, and the cathode is connected to the voltage input end VI, to assist in discharging the first end of the second capacitor C2 when the first control signal SW1 is switched to a logic high level. As may be understood, in a case that there is no first diode D1, after the signal output port P1 of the control chip 22 outputs a logic low level to cause the battery-powered product to automatically shut down, the second capacitor C2 is fully charged, and the third end of the first switch element Q1 returns to a high level. In this case, if the user operates the sensor 21 to perform a power-off operation or resets the magnetic element at this time, the sensor 21 is switched from outputting a logic low level to outputting a logic high level. Since the voltages of the two ends of the second capacitor C2 cannot be abruptly changed, a voltage V of the third end of the first switch element Q1 is instantly increased from the voltage VIN inputted by the voltage input end V1 to 2VIN, and discharges slowly through the first resistor R1. If, in a process of slowly discharging by the first resistor R1, the user operates the battery-powered product to be turned on again, the sensor 21 outputs a logic low level, in this case, the voltage V of the third end of the first switch element Q1 (VIN<V<2VIN) drops by a level of VIN, and the voltage may still be greater than a voltage at which the first switch element Q1 is conductive. As a result, the first switch element Q1 cannot be conducted. Or, in an extreme case, such as in a case that the sensor 21 outputs a logic low level, the control chip 22 independently controls the first switch element Q1 to be disconnected, the user operates the sensor 21 to shut down and then rapidly performs a power-on action, the sensor 21 is quickly switched from outputting a logic high level to outputting a logic low level, and the voltage of the third end of the first switch element Q1 is lowered from 2VIN to VIN. As a result, the battery-powered product cannot be turned on. In this embodiment, by arranging the first diode D1, when the user performs a power-off operation, the sensor 21 is switched from outputting a logic low level to outputting a logic high level, the existence of the first diode D1 assists in discharging the first end of the second capacitor C2, the voltage of the third end of the first switch element Q1 is maintained at a voltage close to the VIN value, the first diode D1 has the functions of fast discharge and clamping voltage here, and the first switch element Q1 still remains a power-off state. When the user quickly performs a power-on operation after a shutdown, causing the sensor 21 to be switched from outputting a logic high level to outputting a logic low level, the voltage of the third end of the first switch element Q1 is quickly lowered, thereby implementing a rapid power-on.

Figure 5:
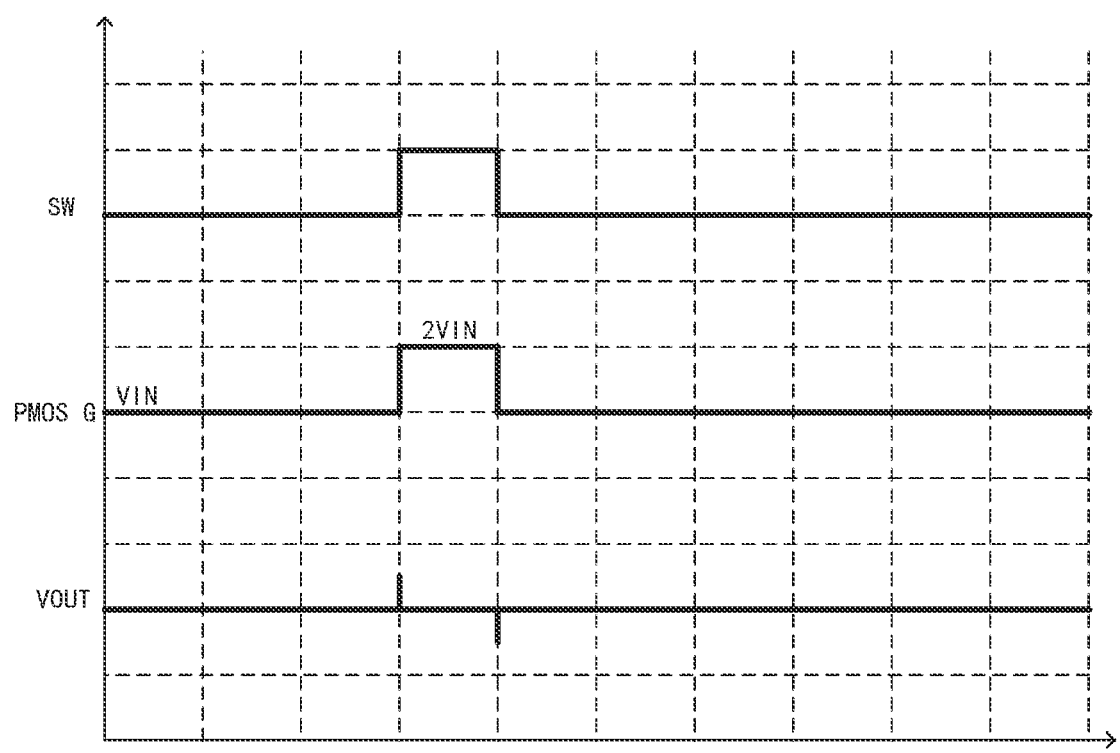
FIG. 5 is a timing diagram of a first control signal, a voltage of a third end of a first switch element, and an output voltage of a voltage output end according to a comparative example of this application.

Referring to FIG. 5, FIG. 5 is a timing diagram of a first control signal, a voltage of a third end of a first switch element, and an output voltage of a voltage output end according to a comparative example of this application. In FIG. 5, there is no first diode D1 in the power on/off circuit 3, the first switch element Q1 is a PMOS transistor, when the battery-powered product shuts down to switch the first control signal SW1 to a logic high level, a voltage of a gate of the first switch element Q1 instantly rises to 2VIN, and is slowly discharged by the first resistor R1 during the power-off, and then when the battery-powered product is turned on to switch the first control signal SW1 to a logic low level, the dropped voltage of the gate of the first switch element Q1 is still greater than the voltage at which the first switch element Q1 is conductive. As a result, the battery-powered product cannot be turned on and there is no voltage output at the voltage output end V2.

Figure 6:
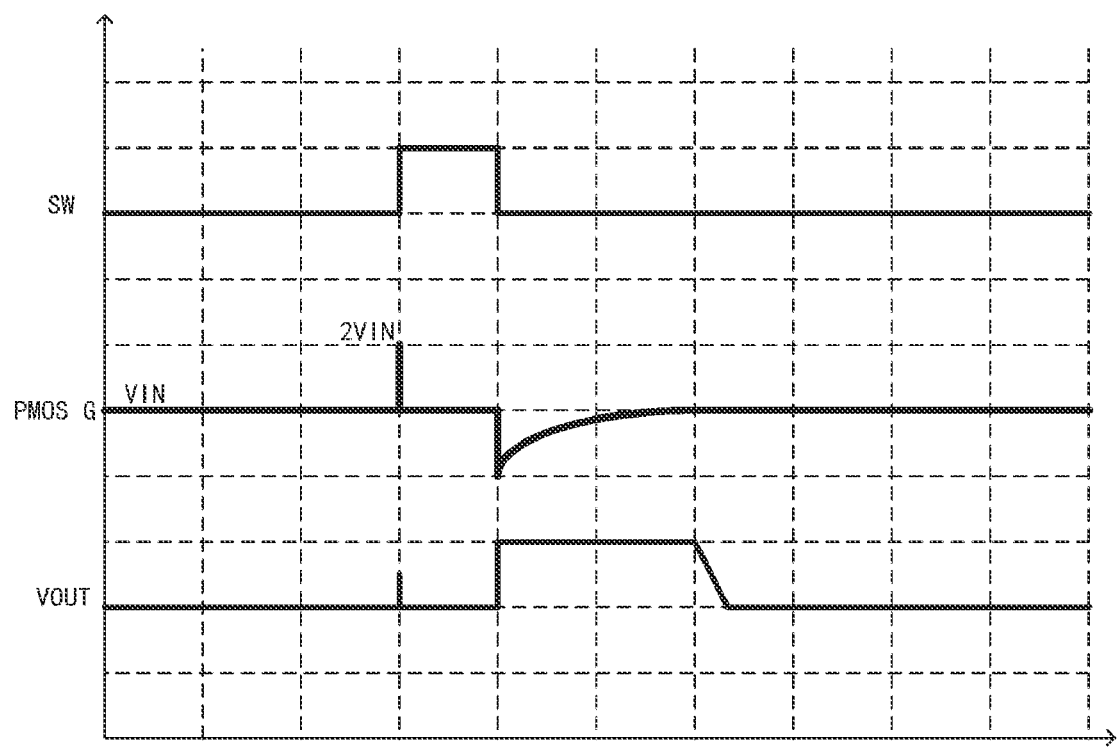
FIG. 6 is a timing diagram of a first control signal, a voltage of a third end of a first switch element, and an output voltage of a voltage output end according to this application.

Referring to FIG. 6, FIG. 6 is a timing diagram of a first control signal, a voltage of a third end of a first switch element, and an output voltage of a voltage output end according to this application. In FIG. 6, the first diode D1 is arranged in the power on/off circuit 3, when the battery-powered product shuts down to switch the first control signal SW1 to a logic high level, after a voltage of a gate of the first switch element Q1 instantly rises to 2VIN, the voltage of the gate of the first switch element Q1 drops rapidly to VIN due to the role of the auxiliary discharge of the first diode D1, and then, when the battery-powered product turns on to switch the first control signal SW1 to a logic low level, the voltage of the gate of the first switch element Q1 falls to a voltage equal to or less than the voltage at which the first switch element Q1 is conductive, the first switch element Q1 is conducted, the battery-powered product is turned on, and the voltage output end V2 outputs a voltage to supply power to the load. The second switch element Q2 is an NMOS transistor, and during the time when the voltage output end V2 outputs a high level, the control chip 22 may control the signal output port P1 through the second switch element Q2 to output a logic high level, so that the first switch element Q1 is continuously conductive, to keep the power-on state; and according to an actual need, the control chip 22 may independently control the signal output port P1 to output a logic low level through the second switch element Q2 to shut off the first switch element Q1, so as to implement the shutdown.

In this embodiment, the cathode of the second diode D2 is connected to the second end of the second capacitor C2 connected to the sensor 21, and the anode is connected to the detection feedback port P2 of the control chip 22, to detect the first control signal SW1 outputted by the sensor 21, and to feed back a change in the first control signal SW1 to the control chip 22.

Figure 7:
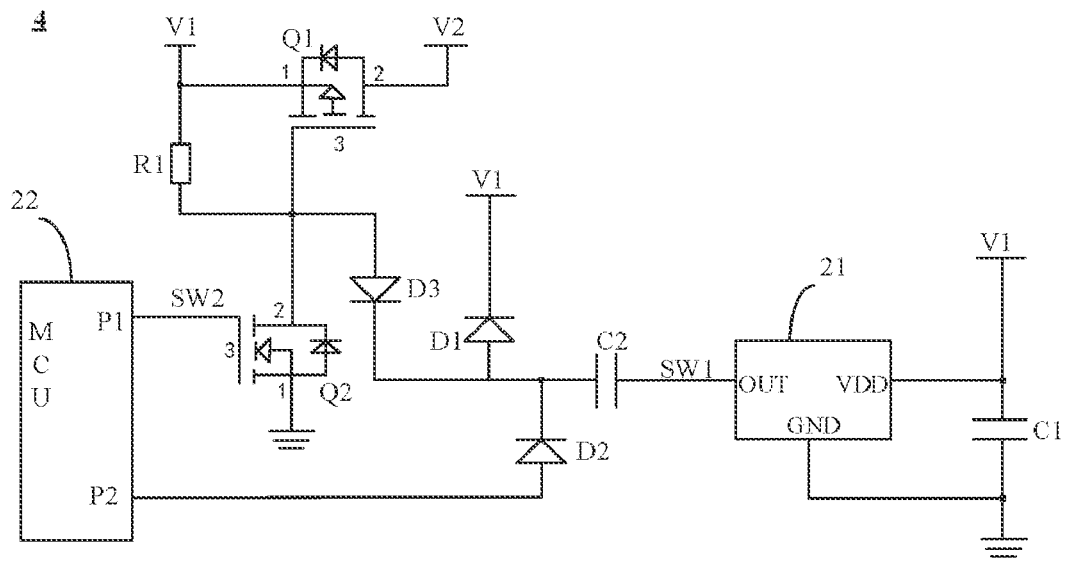
FIG. 7 is a circuit diagram of a power on/off circuit according to a fourth embodiment of this application.

Referring to FIG. 7, FIG. 7 is a circuit diagram of a power on/off circuit according to a fourth embodiment of this application. Different from the power on/off circuit 3, in a power on/off circuit 4 according to this embodiment, the cathode of the second diode D2 is connected to the first end of the second capacitor C2, the anode is connected to the detection feedback port P2 of the control chip 22, an anode of a third diode D3 is connected to the third end of the first switch element Q1, and a cathode is connected to the first end of the second capacitor C2.

Specifically, since the second diode D2 is connected to the first end of the second capacitor C2, a signal outputted from the detection feedback port P2 of the control chip 22 is no longer a level signal, but a pulse signal, and since the second control signal SW2 outputted from the signal output port P1 lowers a voltage of the third end of the first switch element Q1 after the battery-powered product is turned on, it is necessary to increase the third diode D3 so that a change in the pulse signal can be detected before the battery-powered product is turned off.

Figure 8:
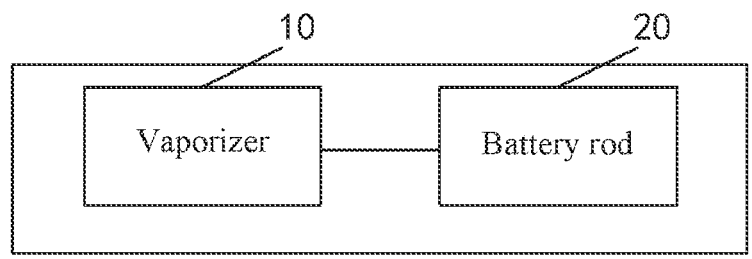
FIG. 8 is a schematic structural diagram of an electronic vaporization device according to an embodiment of this application.

Referring to FIG. 8, an electronic vaporization device includes a vaporizer 10 and a battery rod 20. The vaporizer 10 stores a to-be-vaporized matrix. The battery rod 20 is electrically connected to the vaporizer 10 to supply power to the vaporizer 10 so that the vaporizer 10 heats and vaporizes the to-be-vaporized matrix.

Figure 9:
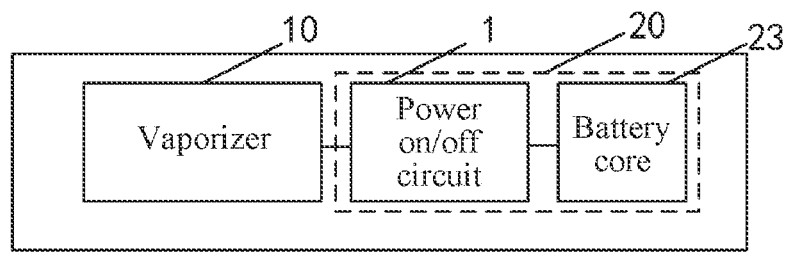
FIG. 9 is a schematic structural diagram of an electronic vaporization device according to another embodiment of this application.

In an implementation, referring to FIG. 9, the battery rod 20 includes a battery core 23 and a circuit board. The battery core 23 is configured to store electrical energy, the power on/off circuit according to any of the above embodiments is arranged on the circuit board, when the user performs the power-on operation, the first switch element Q1 is conductive, and the battery core 23 provides a voltage to vaporize the to-be-vaporized matrix for the vaporizer 10 through the circuit board.

The foregoing descriptions are merely implementations of this application, and the protection scope of this application is not limited thereto. All equivalent structure or process changes made according to the content of this specification and accompanying drawings in this application or by directly or indirectly applying this application in other related technical fields shall fall within the protection scope of this application.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A power on/off circuit, comprising:
   a sensor configured to generate a corresponding first control signal based on a user operation;
   a first switch element, a first end of the first switch element being connected to a voltage input end, a second end of the first switch element being connected to a voltage output end, the voltage input end being connected to a power supply voltage; and
   a capacitor connected between a third end of the first switch element and the sensor, the capacitor being configured to control an on-off of the first switch element based on the first control signal; and a control chip comprising a signal output port connected to the third end of the first switch element and configured to issue a second control signal to control the on-off of the first switch element; and a first diode, a cathode of the first diode being connected to the voltage input end, and an anode of the first diode being connected to a first end of the capacitor, wherein the first control signal is switched to a logic low level when the sensor is triggered based on a power-on operation of the user, and wherein the first control signal is switched to a logic high level when the sensor is reset.

2. The power on/off circuit of claim 1, further comprising:

a second switch element, a first end of the second switch element being connected to a ground voltage, a second end of the second switch element being connected to the third end of the first switch element, and a third end of the second switch element being connected to the signal output port to receive a second control signal issued by the control chip, wherein the control chip is configured to issue the second control signal to control the on-off of the second switch element.

3. The power on/off circuit of claim 2, wherein the first switch element comprises a PMOS transistor, and wherein the second switch element comprises an NMOS transistor.

4. The power on/off circuit of claim 1, further comprising:

a first resistor, a first end of the first resistor being connected to the voltage input end, and a second end of the first resistor being connected to the third end of the first switch element and an end of the capacitor.

5. The power on/off circuit of claim 1, further comprising:

a second diode, a cathode of the second diode being connected to a first end of the capacitor or a second end of the capacitor connected to the sensor, and an anode of the second diode being connected to a detection feedback port of the control chip to feed back a change in the first control signal to the control chip.

6. The power on/off circuit of claim 5, wherein, when the cathode of the second diode is connected to the first end of the capacitor, the power on/off circuit further comprises:

a third diode, an anode of the third diode being connected to the third end of the first switch element, and a cathode of the third diode being connected to the first end of the capacitor.

7. An electronic vaporization device, comprising:

the power on/off circuit of claim 1.

8. A power on/off circuit, comprising:

a sensor configured to generate a corresponding first control signal based on a user operation;

a first switch element, a first end of the first switch element being connected to a voltage input end, a second end of the first switch element being connected to a voltage output end, the voltage input end being connected to a power supply voltage; and a capacitor connected between a third end of the first switch element and the sensor, the capacitor being configured to control an on-off of the first switch element based on the first control signal;

a control chip comprising a signal output port connected to the third end of the first switch element and configured to issue a second control signal to control the on-off of the first switch element; and a second diode, a cathode of the second diode being connected to a first end of the capacitor or a second end of the capacitor connected to the sensor, and an anode of the second diode being connected to a detection feedback port of the control chip to feed back a change in the first control signal to the control chip, wherein the first control signal is switched to a logic low level when the sensor is triggered based on a power-on operation of the user, and wherein the first control signal is switched to a logic high level when the sensor is reset.

9. The power on/off circuit of claim 8, wherein, when the cathode of the second diode is connected to the first end of the capacitor, the power on/off circuit further comprises:

a third diode, an anode of the third diode being connected to the third end of the first switch element, and a cathode of the third diode being connected to the first end of the capacitor.

* * * * *